United States Patent [19]

Doi

[11] Patent Number: 4,747,091
[45] Date of Patent: May 24, 1988

[54] SEMICONDUCTOR LASER DRIVE DEVICE
[75] Inventor: Masanori Doi, Akishima, Japan
[73] Assignee: Olympus Optical Co., Ltd., Tokyo, Japan
[21] Appl. No.: 884,978
[22] Filed: Jul. 14, 1986
[30] Foreign Application Priority Data Jul. 25, 1985 [JP] Japan .................................. 60-164813
Oct. 7, 1985 [JP] Japan .................................. 60-223240

[51] Int. Cl.$^4$ ........................ G11B 7/00; G11B 27/36
[52] U.S. Cl. .................................... 369/116; 369/122; 369/54
[58] Field of Search .................. 369/54, 58, 106, 121, 369/122, 116; 346/76 L, 135.1

[56] References Cited
U.S. PATENT DOCUMENTS 4,509,156 4/1985 Ohara et al. ........................... 369/54
4,577,320 3/1986 Yoshikawa et al. .

Primary Examiner—Robert L. Richardson
Attorney, Agent, or Firm—Frishauf, Holtz, Goodman & Woodward

[57] ABSTRACT

A semiconductor laser drive device is adopted in an optical disk read/write unit for writing/reading data in/from an optical disk. The device has driver for modulating the laser beam of the intensity corresponding to a drive current value in accordance with write data WDATA, photodiode for detecting the light-emitting intensity of semiconductor laser, and APC circuit for comparing the detected light-emitting intensity of photodiode with a desired light-emitting intensity and changing the drive current value for semiconductor laser until the detected light-emitting intensity coincides with the desired light-emitting intensity. APC circuit has battery backup memory. A drive current value obtained at the start of the device is stored in memory. Thereafter, APC circuit starts APC from the stored drive current value. After APC is completed, when the drive current value calculated by APC circuit is different from the stored drive current value, the drive current value stored in battery backup memory is updated to the drive current value calculated by APC circuit. After APC is completed, when the difference between the drive current value calculated by APC circuit and the stored drive current value exceeds a predetermined value, APC circuit determines that the service life of semiconductor laser is exhausted.

5 Claims, 14 Drawing Sheets

F I G. 6A
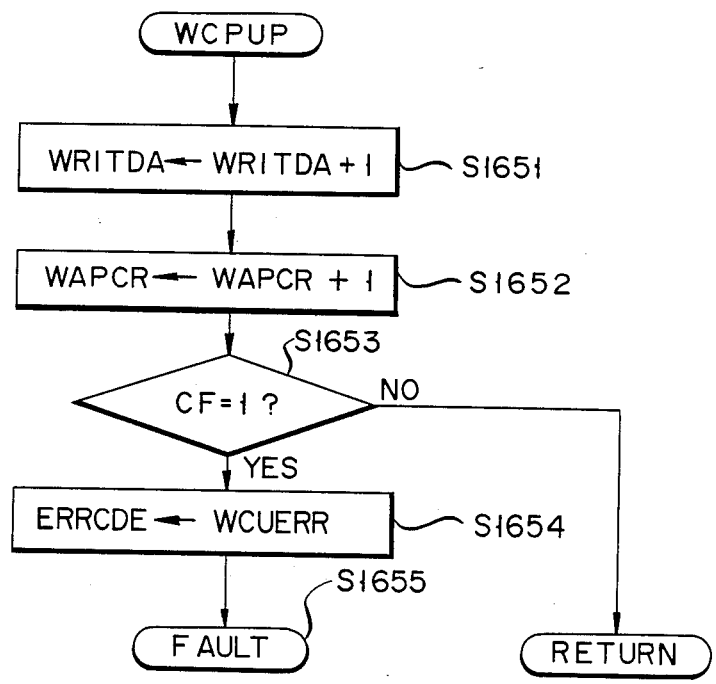

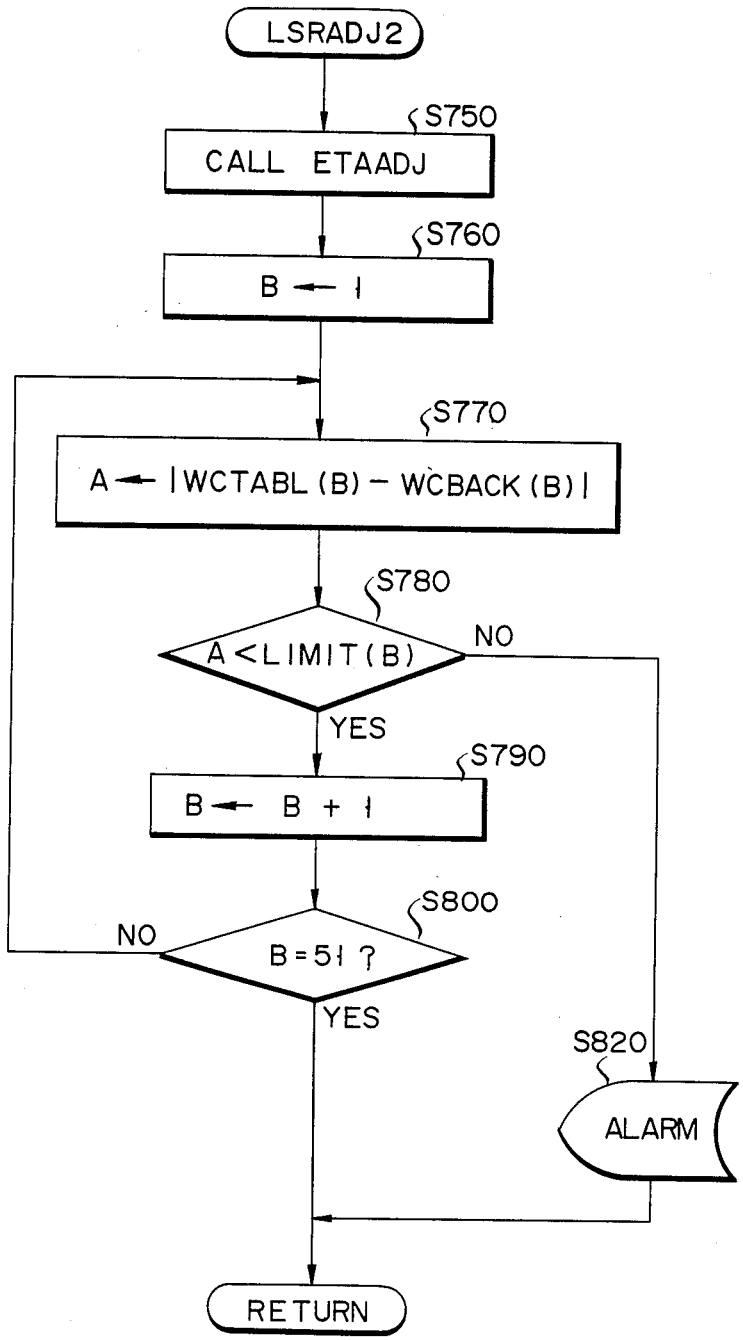

SEMICONDUCTOR LASER DRIVE DEVICE

BACKGROUND OF THE INVENTION

The present invention relates to a semiconductor laser drive device and, more particularly, to an APC (automatic power control) for controlling a drive current to obtain a desired output level of the semiconductor laser.

Semiconductor lasers generally have variations in characteristics from one to another and furthermore each laser exhibits deterioration in output characteristics over time. In order to obtain a desired output intensity of a semiconductor laser, an APC circuit is indispensable. Conventional APC circuits detect the output intensity of the semiconductor laser, compare the detected intensity with a desired intensity, and feed back the comparison results to the drive circuit in order to make the drive current match the output intensity with the desired intensity. Such conventional APC circuits always start APC from a drive current of 0. Therefore, it takes extra time to stabilize the drive current. This is significant particularly when the optical output must be modulated in accordance with write data, e.g., when the semiconductor laser is utilized for writing data on an optical disk, thereby disabling high-speed writing.

It has also been desired to detect the remaining service life of a semiconductor laser which changes due to the deterioration over time. Conventionally, a reference value of the drive current is predetermined based on the specifications, and the drive current set by the APC is compared therewith to detect the remaining service life of the semiconductor laser. However, the reference value is set with a relatively large margin in view of variations in characteristics of individual semiconductor lasers. As a result, in some cases the service life is not determined until it is exhausted, and cannot be determined beforehand.

SUMMARY OF THE INVENTION

It is an object of the present invention to provide a semiconductor laser drive device which can execute APC within a short period of time.

It is another object of the present invention to provide a semiconductor laser drive device which can exactly determine the service life of a semiconductor laser in accordance with characteristics thereof before the service life is exhausted.

According to the present invention, there is provided a semiconductor laser drive device comprising an APC circuit for energizing a semiconductor laser, detecting an intensity of a laser beam, comparing a desired intensity and the detected intensity, and for controlling a drive current to match the detected intensity with the desired intensity, a first circuit for energizing said APC circuit at a first time point and for storing a plurality of drive currents which correspond to a plurality of intensities and are controlled by the APC circuit, second circuit for energizing the APC circuit at a second time point later than the first time point with the drive current corresponding to one of the intensities stored in the first circuit; and a third circuit for, when the drive current corresponding to said one of the intensities is changed by the APC circuit at the second point of time, correcting the drive current corresponding to one of the other intensities and for energizing the APC circuit with the corrected drive current at a third time point later than the second time point.

BRIEF DESCRIPTION OF THE DRAWINGS

FIG. 6A is a flow chart of a subroutine for increasing the write drive current of FIG. 5;

FIG. 14 is a flow chart of a normal APC operation of the third embodiment.

DETAILED DESCRIPTION OF THE PREFERRED EMBODIMENTS

Figure 1:
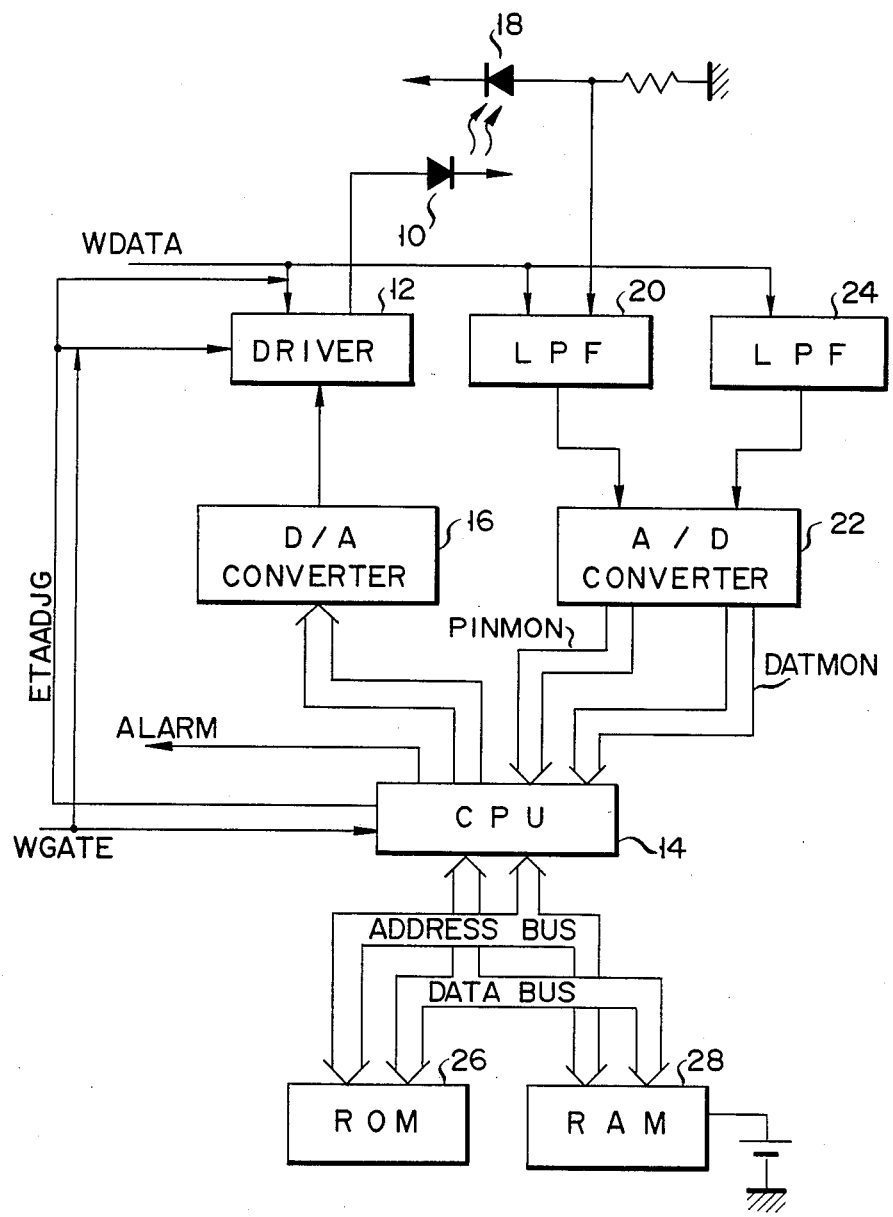
FIG. 1 is a block diagram of a semiconductor laser drive device according to an embodiment of the present invention.

A semiconductor laser drive device according to an embodiment of the present invention will be described with reference to the accompanying drawings. FIG. 1 is a block diagram of the first embodiment. A case will be described wherein the present invention is applied to a semiconductor laser drive device adopted in an optical or magneto-optical disk write/read unit for writing/reading data in/from an optical or magneto-optical disk.

A drive current from driver 12 is supplied to semiconductor laser 10. The light-emitting intensity of laser 10 is controlled in accordance with the drive current. In an optical or magneto-optical disk write/read unit of this type, laser 10 is controlled in a different manner in the write and read modes. When data is written, laser light is intensity-modulated in accordance with write data and is emitted onto the optical or magneto-optical disk. The optical conditions of the irradiated surface of the disk are changed to write data. For this purpose, write data WDATA for modulating the laser light intensity is supplied to driver 12. Various control data including drive current data is supplied to driver 12 from CPU 14 through D/A converter 16. When data is read out, laser light with a predetermined intensity (normally the same intensity as the low intensity of the intensity-modulated light is used for simplifying the circuitry) is emitted onto the disk, and the intensity or the angle of the polarizing plane of the light reflected by the disk is measured. For the sake of simplicity, the low intensity of the intensity-modulated light is referred to as a read intensity and the high-intensity is referred to as a write intensity. Assume that the optical disk is rotated at a constant angular velocity. Then, the outer a track on the optical disk, the faster the linear velocity thereof with respect to the laser beam, and the lower the light intensity per unit area. This does not present any problem in the read mode. In the write mode, however, since the light intensity per unit area is lower at the outer tracks, in some cases data cannot be written in the optical disk accurately. In order to prevent this, the intensity of the write laser beam is changed in accordance with the position of the track. A write gate signal WGATE for selecting a write mode or read mode is supplied to CPU 14 and driver 12.

The intensity of the laser beam emitted by semiconductor laser 10 onto the optical disk is detected by photodiode (PIN-type photodiode) 18, and a detection signal from photodiode 18 is input to CPU 14 through LPF 20 and A/D converter 22. The data output from LPF 20 and A/D-converted by A/D converter 22 serves as light-emitting intensity data PINMON. Write data WDATA is input to CPU 14 through LPF 24 and A/D converter 22. The data output from LPF 24 and A/D-converted by A/D converter 22 serves as write data monitor signal DATMON. LPFs 20 and 24 are averaging circuits.

ROM 26 and RAM 28 are connected to CPU 14 through address and data buses. A desired light-emitting intensity (specifically, upper and lower limits RDLMTH and RDLMTL of a read intensity allowable range, and lower limit WCTHS(i) of a write intensity allowable range) (to be described later) as the target in performing APC control of semiconductor laser 10 is stored in ROM 26. Note that i is the variable depending on the position of the track. Read and write drive current data READDA and WRITDA(i) are initially set in RAM 28. RAM 28 has write APC register WAPCR. Note that RAM 28 is battery backed-up. An instruction signal ETAADJG is supplied from CPU 14 to driver 12.

The operation of the first embodiment will be described with reference to the flow charts in FIGS. 2 to 6, 8, 9 and the signal waveform charts of FIGS. 7 and 10. For the sake of simplicity, each flow chart shows a subroutine executed by CPU 14 as required.

Figure 2:
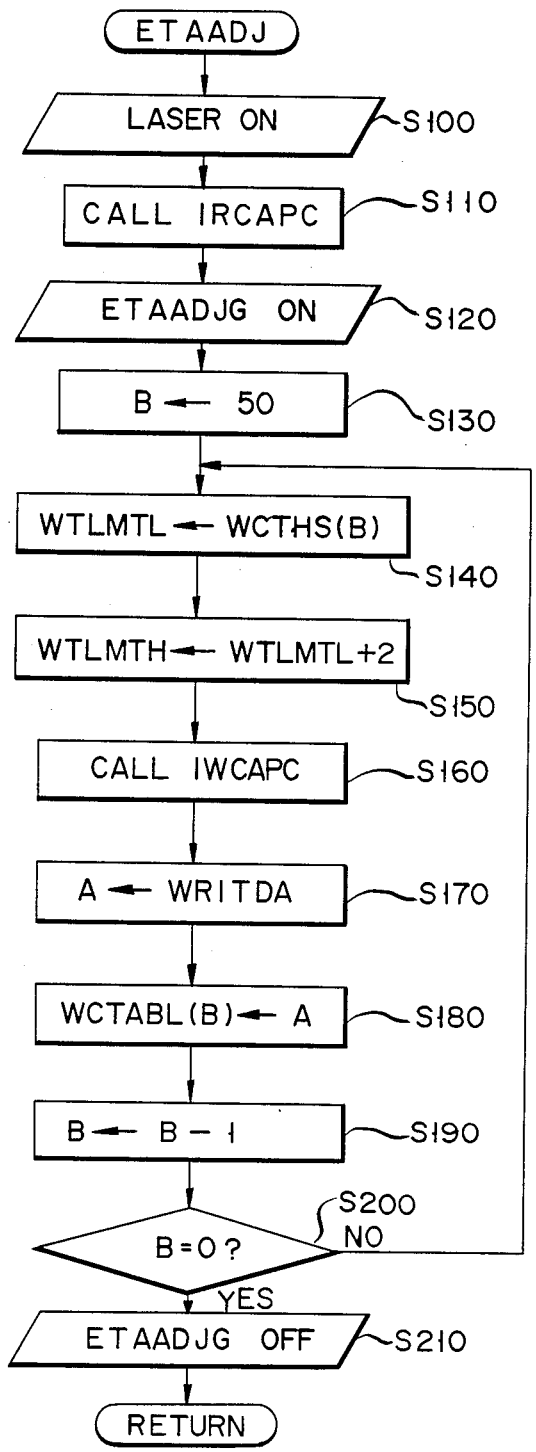
FIG. 2 is a flow chart for initializing read and write drive current values in a RAM separately as a drive current for allowing the semiconductor laser of the first embodiment to emit light at a desired intensity.

FIG. 2 is a flow chart for initially setting read and write drive current data READDA and WCTABL(i) (=WRITDA(i)) for allowing laser 10 to emit light at read and write intensities, respectively. Note that i is the track block address, and 1 track block has 400 tracks and obtained by dividing 20,000 tracks into 50 track blocks. Subroutine ETAADJ is initiated immediately upon turning ON of the power source.

Semiconductor laser 10 is turned ON in step S100. When write gate WGATE is not input, laser 10 emits light at a read intensity in response to read drive current data READDA.

In step S110, subroutine IRCAPC for obtaining data READDA, with which the light-emitting intensity of laser 10 becomes a desired value, is called.

Figure 3:
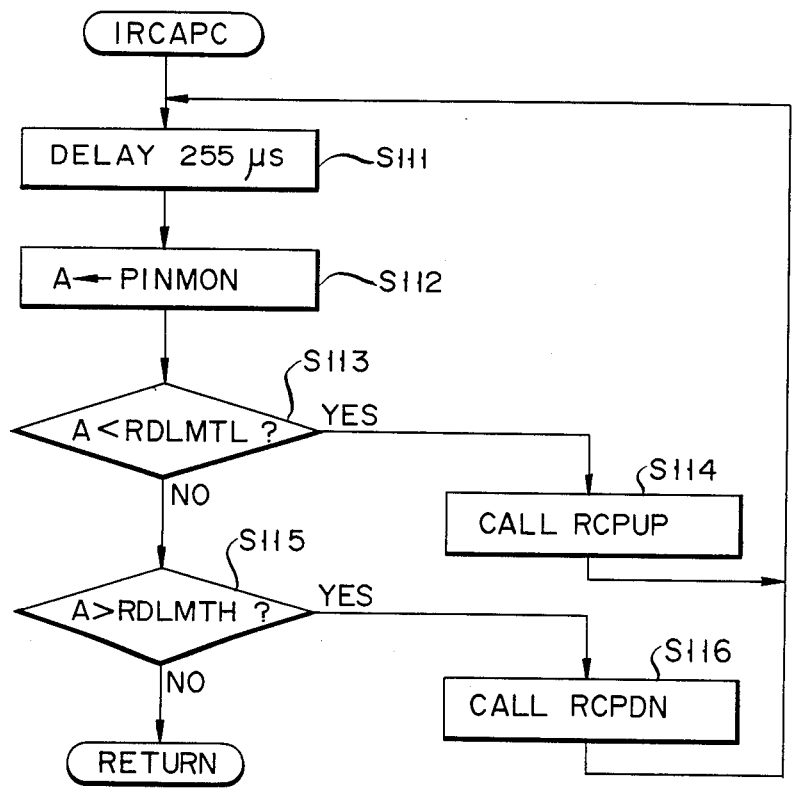
FIG. 3 is a flow chart of a subroutine for setting the read drive current of FIG. 2.

Subroutine IRCAPC is shown in FIG. 3. In step S111, a delay operation for 255 $\mu$m is performed to compensate for the delay time caused by the APC operation.

In step S112, light-emitting intensity data PINMON of laser 10 which is detected by photodiode 18 and output from LPF 20 is set in general register (accumulator) A in CPU 14.

In step S113, it is checked whether the data in register A is lower than lower limit RDLMTL of the read intensity allowable range.

If YES in step S113, subroutine RCPUP (FIG. 4) for increasing the drive current is called in step S114. After step S114, step S111 is executed.

If NO in step S113, it is checked in step S115 whether the data of register A is higher than upper limit RDLMTH of the read intensity allowable range.

If YES in step S115, subroutine RCPDN (FIG. 4B) for decreasing the drive current is called in step S116. After step S116, step S111 is executed.

If NO in step S115, subroutine IRCAPC ends.

Upper and lower limits RDLMT and RDLMTL of the read intensity allowable range are stored in advance in ROM 26.

The subroutines for increasing/decreasing the drive current will be described with reference to FIGS. 4A and 4B.

Figure 4A:
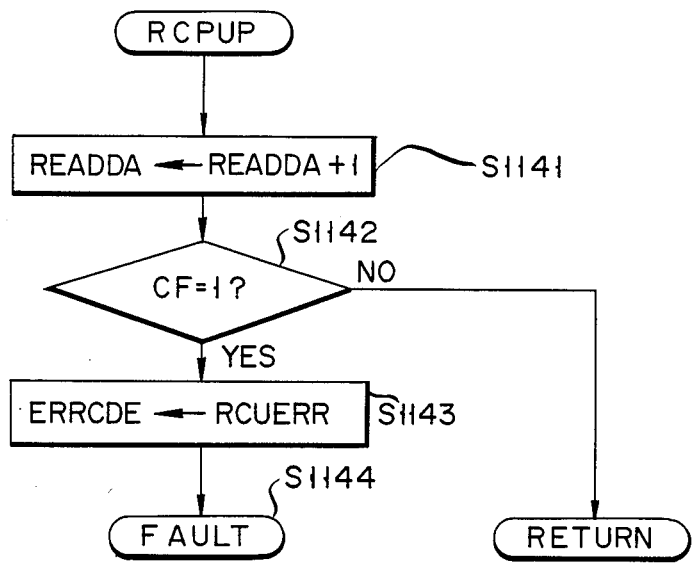
FIG. 4A is a flow chart of a subroutine for increasing the read drive current of FIG. 2.

In subroutine RCPUP, read drive current data READDA is incremented by 1 in step S1141, as shown in FIG. 4A. This increases the light-emitting intensity (read intensity) of laser 10. It is then checked if data READDA exceeds the maximum conversion allowable value of D/A converter 16 and, if YES, carry flag CF is set to "1".

In step S1142, it is checked whether carry flag CF is "1". If NO in step S1142, subroutine RCPUP ends. If YES in step S1142, read current upper error code RCUERR is set in error code register ERRCDE in step S1143, and fault processing is executed in step S1144. In fault processing, the condition of the device is changed to inactive from active and a kind of error and status of error generation are displayed.

Figure 4B:
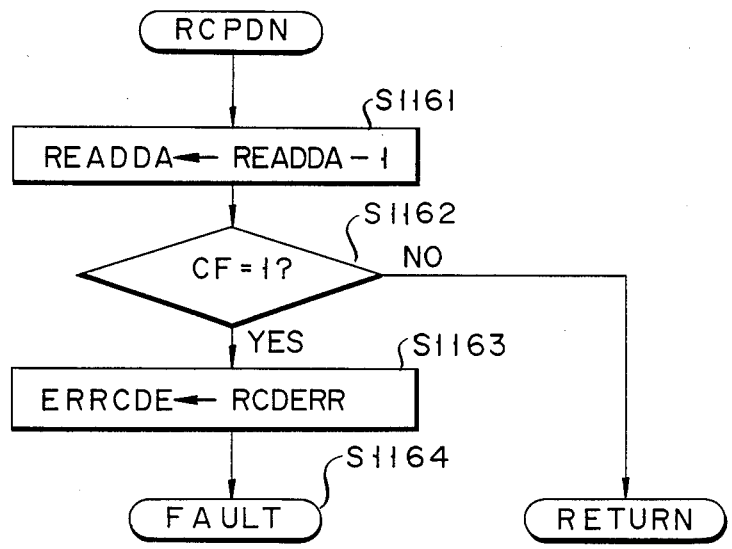
FIG. 4B is a flow chart of a subroutine for decreasing the read drive current of FIG. 3.

In subroutine RCPDN, read drive current data READDA is decremented by 1 in step S1161, as shown in FIG. 4B. This decreases the light-emitting intensity (read intensity) of laser 10. It is then checked if data READDA is less than the minimum conversion allowable value of D/A converter 16 and, if YES, carry flag CF is set to "1".

In step S1162, it is checked whether carry flag CF is "1". If NO in step S1162, subroutine RCPDN ends. If YES in step S1162, read current lower error code RCDERR is set in error code register ERRCDE in step S1163, and fault processing is executed in step S1164.

Back to subroutine ETAADJ of FIG. 2, after subroutine IRCAPC ends, an APC start instruction ETAADJG for setting the write drive current is output in step S120. When ETAADJG is input to driver 12, the laser 10 is controlled so as to maintain the output intensity in a write level without regard to write data WDATA.

In step S130, 50 is set in general register B in CPU 14. The data stored in register B is track block address i, as described before.

In step S140, parameter WTLMTL representing the lower limit of the write intensity allowable range is updated to data WCTHS(B) which is stored in ROM 26 in advance.

In step S150, parameter WTLMTH representing the upper limit of the write intensity allowable range is updated to lower limit WTLMTL+2.

In step S160, subroutine IWCAPC for obtaining write drive current data WRITDA, at which the light-emitting intensity of laser 10 becomes a desired write intensity, is called.

Figure 5:
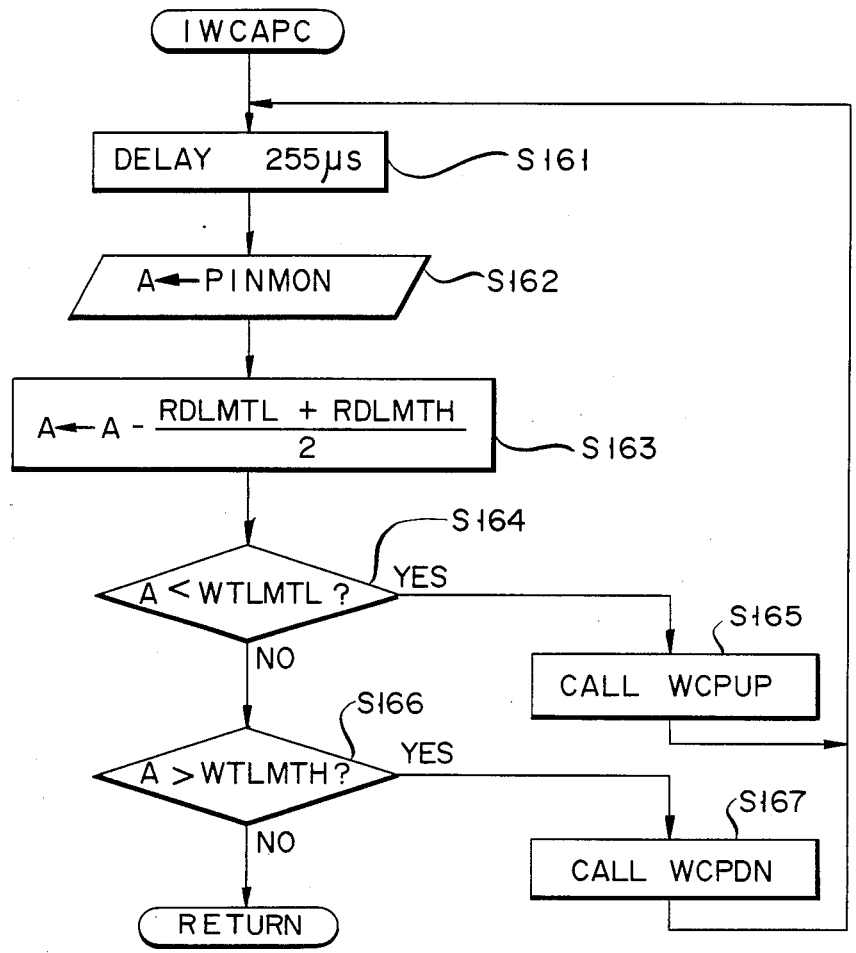
FIG. 5 is a flow chart of a subroutine for setting the write drive current of FIG. 2.

Subroutine IWCAPC is shown in FIG. 5. In step S161, a delay operation for 255 μm is performed in order to compensate for the delay time caused by the APC operation.

In step S162, light-emitting intensity data PINMON of laser 10 which is detected by photodiode 18 and output from LPF 20 is set in general register A in CPU 14.

Figure 7:
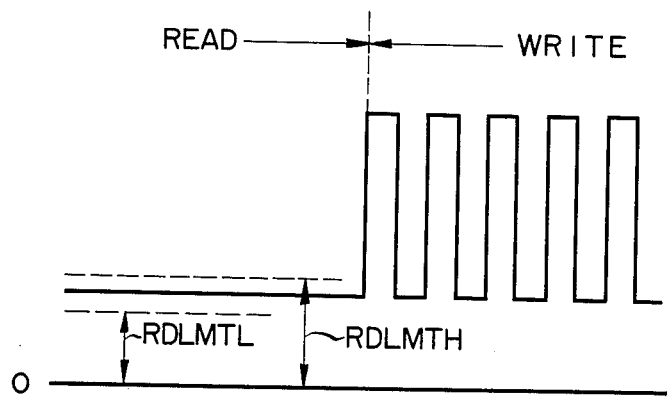
FIG. 7 is a waveform chart of read and write light-emitting intensities.

In step S163, the read intensity is subtracted from data PINMON output from photodiode 18 in order to obtain a true write intensity (modulated component) since the write intensity is the read intensity plus the modulated component, as shown by the light-emitting intensity of the semiconductor laser 10 in FIG. 7. In this case, however, the read intensity is not an actually measured value, but is an intermediate intensity between upper and lower limits RDLMTH and RDLMT of read intensity allowable range.

In step S164, it is checked whether the data in register A is less than lower limit WTLMTL of the write intensity allowable range.

If YES in step S164, subroutine WCPUP (FIG. 6A) for increasing the drive current is called in step S165. After step S165, step S161 is executed.

If NO in step S164, it is checked in step S166 whether the data in register A is higher than upper limit WTLMTH of the write intensity allowable range.

If YES in step S166, subroutine WCPDN (FIG. 6B) for decreasing the drive current is called in step S167. After step S167, step S161 is executed.

If NO in step S166, subroutine IWCAPC ends.

The subroutines for increasing/decreasing the write drive current will be described with reference to FIGS. 6A and 6B.

In subroutine WCPUP, write drive current data WRITDA is incremented by 1 in step S1651, as shown in FIG. 6A. This increases the light-emitting intensity (write intensity) of semiconductor laser 10. It is then checked whether write drive current data WRITDA exceeds a maximum conversion allowable value of D/A converter 16 and, if YES, carry flag is set to "1".

In step S1652, the value of write APC register WAPCR is incremented by 1.

In step S1653, it is checked whether carry flag CF is "1". If NO in step S1653, subroutine WCPUP ends. If YES in step S1653, write current upper limit error code WCUERR is set in error code register ERRCDE in step S1654, and fault processing is executed in step S1655.

Figure 6B:
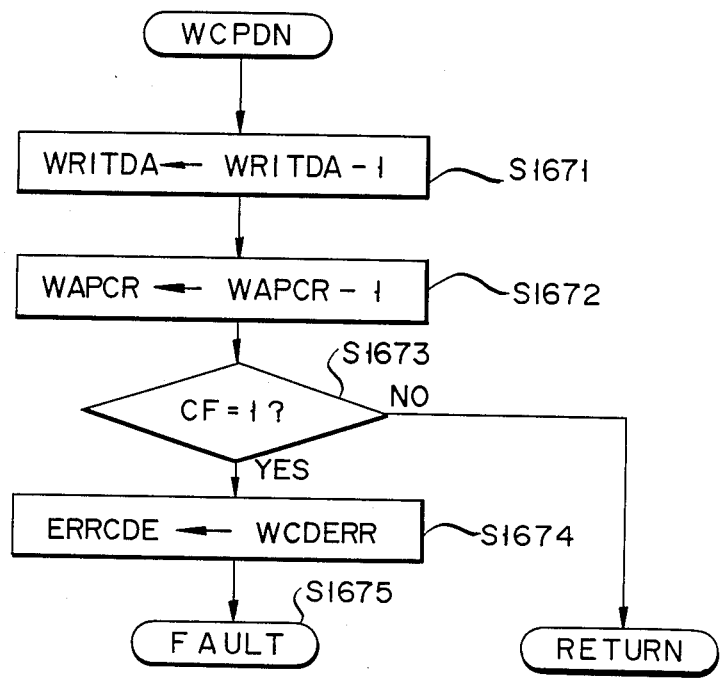
FIG. 6B is a flow chart of a subroutine for decreasing the write drive current of FIG. 5.

In subroutine WCPDN, write drive current data WRITDA is decremented by 1 in step S1671, as shown in FIG. 6B. This decreases the light-emitting intensity (write intensity) of semiconductor laser 10. It is then checked whether write drive current data WRITDA is less than a minimum conversion allowable value of D/A converter 16 and, if YES, carry flag is set to "1".

In step S1672, the value of write APC register WAPCR is decremented by 1.

In step S1673, it is checked whether carry flag CF is "1". If NO in step S1673, subroutine WCPDN ends. If YES in step S1673, write current lower limit error code WCDERR is set in error code register ERRCDE in step S1674, and fault processing is executed in step S1675.

Back to subroutine ETAADJ of FIG. 2, after subroutine IWCAPC ends, write drive current data WRITDA is set in general register A in step S170.

In step S180, data WRITDA in general register A is set in write drive current data table WCTABL(B) of each address block.

In step S190, the value of general register B is decremented by 1.

In step S200, it is checked whether the value of register B becomes 0. If NO in step S200, step S140 is executed.

If YES in step S200, the output of ETAADJG is stopped in step S210, and subroutine ETAADJ ends.

Upon end of subroutine ETAADJ, when a power source is turned on, desired read and write data READDA and WCTABL (i) (=WRITDA(i), i=1 to 50), at which the read and write intensities stored in ROM 26 are obtained, are set (initialization) in RAM 28.

Figure 8:
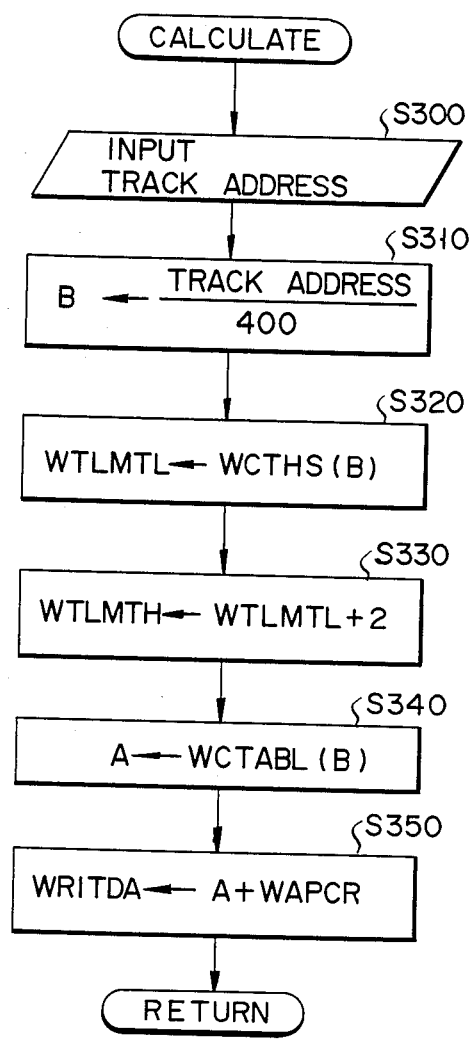
FIG. 8 is a flow chart for updating the write drive current value when the track address is changed in the first embodiment.

FIG. 8 is a flow chart for accessing a track when the device is actually used.

In step S300, a track address is input.

In step S310, the track address is divided by 400 in order to obtain track block address B, since 20,000 tracks are divided into 50 track blocks.

In step S320, lower limit WTLMTL of the write drive current is updated to WCTHS(B).

In step S330, upper limit WTLMTH of the write drive current is updated to WTLMTL+2.

In step S340, write drive current data WCTABL(B) is set in general register A.

In step S350, data WRITDA is updated to A+-WAPCR in write APC register which is set when the write drive current is increased or decreased as shown in FIGS. 6A and 6B. When a write drive current for one address block is thus increased or decreased, write drive current for this address block is increased or decreased in the same manner. Therefore, APC executed for one address block is valid for other address blocks, thereby executing APC for blocks other than the target address blocks quickly.

When subroutine CALCULATE is executed in this manner, write drive current data corresponding to the track block address is read out, and is set in the APC circuit.

Figure 9A:
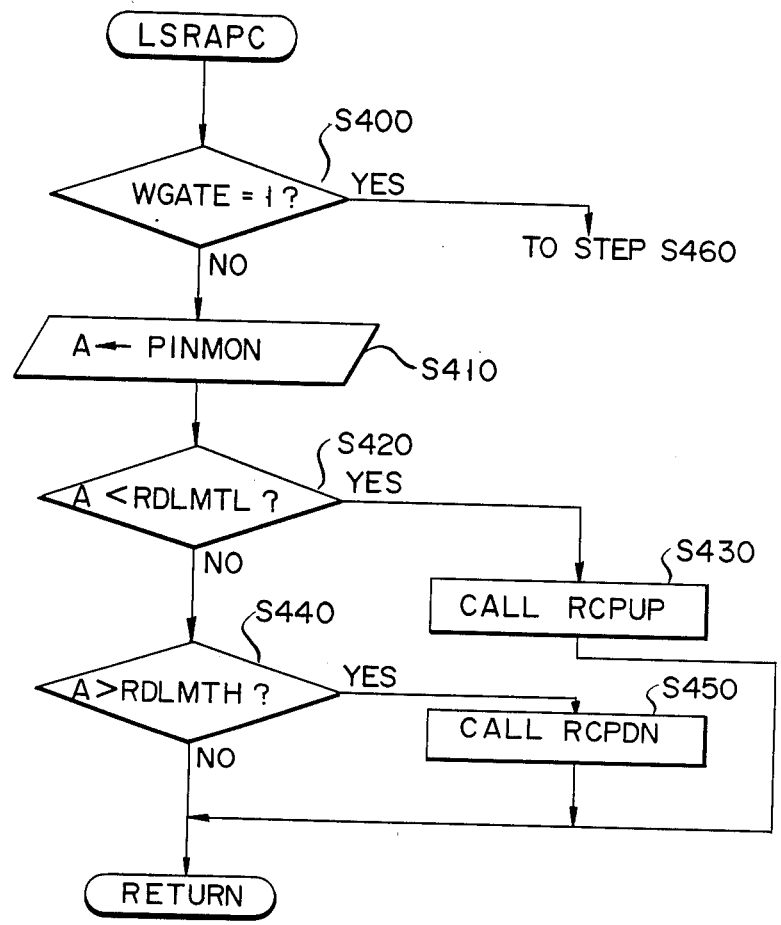
FIGS. 9A and 9B are flow charts of a normal APC operation in the first embodiment.
Figure 9B:
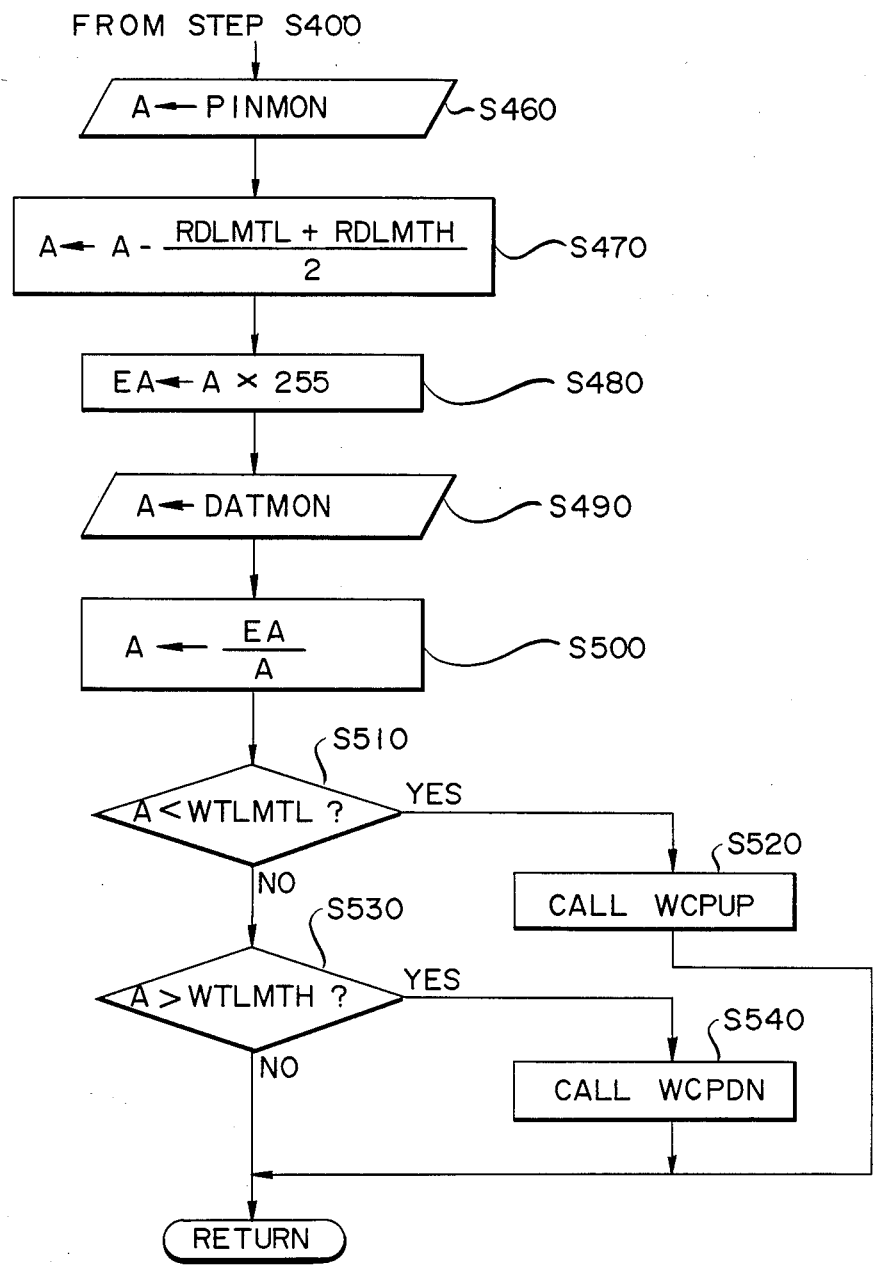
Figure 10:
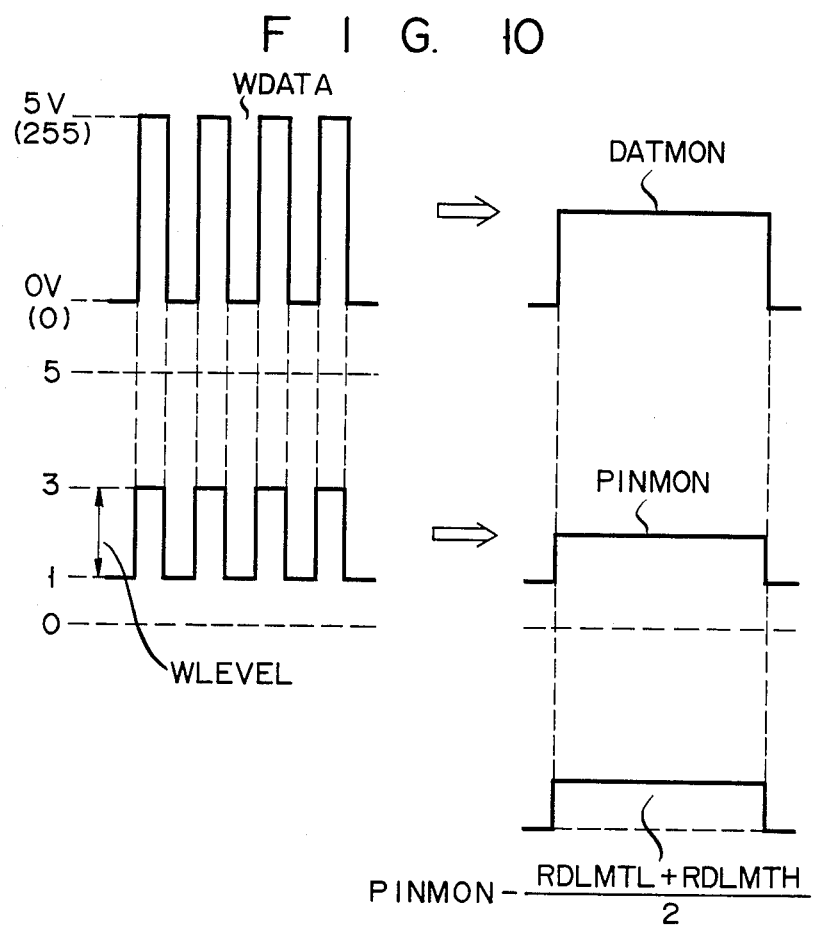
FIG. 10 shows the relationship between the semiconductor laser drive current values and actual optical outputs.

FIGS. 9A and 9B show flow charts of subroutine LSRAPC of the APC operation in normal use. Subroutine LSRAPC is executed after subroutine CALCULATE.

In step S400, it is checked whether write gate signal WGATE is "1". Signal WGATE is set to "1" in the write mode.

If NO in step S400, light-emitting intensity data PINMON as the output from LPF 20 is set in general register A in step S410.

In step S420, it is checked whether the data of register A is less than lower limit RDLMTL of the read intensity allowable range. If YES in step S420, subroutine RCPUP for increasing the read drive current is called in step S430. After step S430, subroutine LSRAPC ends.

If NO in step S420, it is checked in step S440 whether the data of register A is higher than upper limit RDLMTH of the read intensity allowable range.

If YES in step S440, subroutine RCPDN for decreasing the read drive current is called in step S450. After step S450, subroutine LSRAPC ends.

If NO in step S440, subroutine LSRAPC ends.

In this case, since the read drive current has already been subjected to APC in subroutine ETAADJ, it need not be adjusted in normal use as far as no deterioration over time occurs or no variation of ambient temperature, so that a time required to stabilize APC can be short.

If YES in step S400, light-emitting intensity data PINMON as the output from LPF 20 is set in general register A in step S460.

In step S470, the read intensity ((RDLMTH+RDLMTH)/2) is subtracted from output PINMON of photodiode 18, and only the write intensity can be obtained.

In step S480, the value of register A is multiplied by 255 to be updated to EA.

In step S490, write data DATMON as the output from LPF 24 is set in general register A.

In step S500, EA/A is set in register A.

The meaning of steps S460 to S500 will be described. The relationship among write data WDATA, averaged signal (output from LPF 24 through A/D converter 22) DATMON thereof, light-emitting intensity (write intensity) WLEVEL of semiconductor laser 10 which is detected by photodiode 18, and averaged signal (output from LPF 20 through A/D converter 22) thereof is shown in FIG. 10. This relationship will be represented as follows, with symbol (:) representing a ratio therebetween $$WDATA:DATMON=WLEVEL:(PINMON-PINMON \text{ in READ mode}) \quad (1)$$

Equation (1) can be rewritten as:

$$WLEVEL=(PINMON-PINMON \text{ in READ mode}) \times WDATA \div DATMON \quad (2)$$

Assume that "1" and "0" levels of WDATA are 5 V and 0 V, respectively, and that the resolution has 256 levels (0 to 255 with 8 bits). Then, equation (2) can be written as:

$$WLEVEL=(PINMON-PINMON \text{ in READ mode}) \div DATMON \times 255 \quad (3)$$

In step S500, write intensity WLEVEL based on equation (3) is stored in register A.

In step S510, it is checked whether the data in register A is less than lower limit WTLMTL of the write intensity allowable range. If YES in step S510, subroutine WCPUP for increasing the drive current is called in step S520. After step S520, subroutine LSRAPC ends.

If NO in step S510, it is checked in step S530 whether the data in register A is higher than upper limit WTLMTH of the read intensity allowable range. If YES in step S530, subroutine WCPDN for decreasing the drive current is called in step S540. After step S540, subroutine LSRAPC ends.

If NO in step S530, subroutine LSRAPC ends as well.

In this manner, when subroutine LSRAPC is executed, a drive current is first set. Thereafter, it is checked whether the laser intensity is at a desired value and, if not, the drive current is increased or decreased in accordance with the difference between the desired value and the actual laser intensity, thereby executing APC.

As described above, according to the first embodiment of the present invention, the drive current data corresponding to a desired light-emitting intensity is stored in a backup RAM, and APC is started from the stored drive current value. Therefore, APC is stabilized in a short period of time for practical use. Furthermore, when a write drive current for one address block is increased or decreased, write drive current data for the other address block is also increased or decreased. As a result, APC executed for one address block is valid for all the remaining address blocks, so that APC for blocks other than the target address block can be performed quickly.

A second embodiment of the present invention will be described. The object of the second embodiment is to determine the remaining service life of a semiconductor laser by utilizing part of the first embodiment (the drive current data initially set in RAM 28). The circuit diagram of the second embodiment is the same as for the first embodiment (FIG. 1), and is thus omitted.

Figure 11:
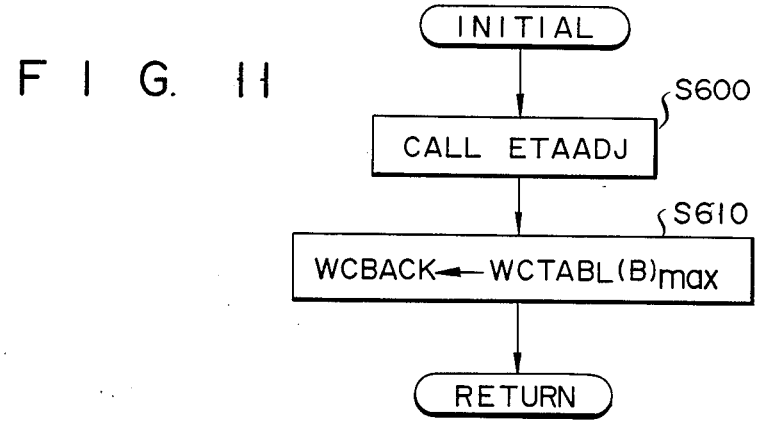
FIG. 11 is a flow chart of the initialization of the semiconductor laser drive device according to the second embodiment of the present invention.
Figure 12:
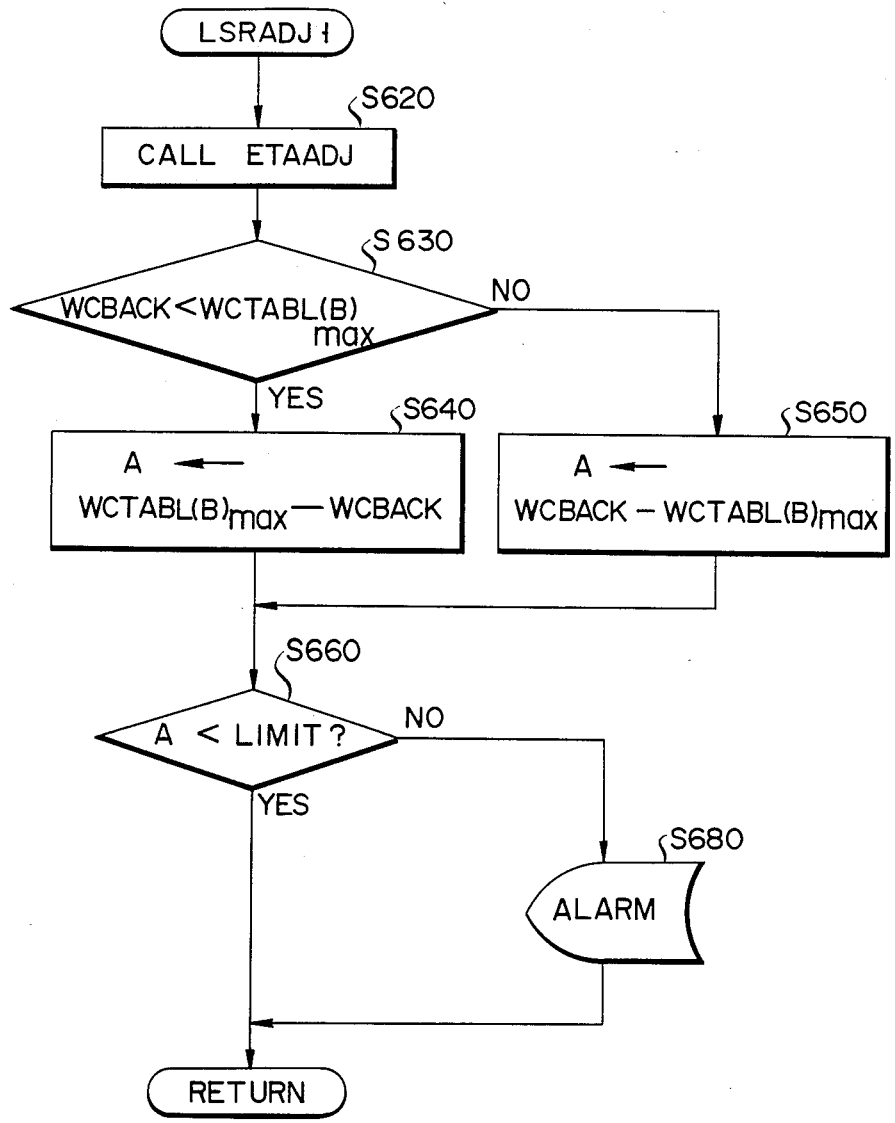
FIG. 12 is a flow chart of a normal APC operation of the second embodiment.

FIGS. 11 and 12 show flow charts of the operation of the second embodiment.

The initial subroutine shown in FIG. 11 is executed only once after the device is manufactured. In step S600, initialization subroutine ETAADJ of the first embodiment is called. In step S610, maximum WCTABL(B)$_{max}$ in write current table WCTABL(B) (B=1 to 50) set in RAM 28 is detected and stored in write current backup memory WCBACK. Maximum WCTABL(B)$_{max}$ is used for determining the service life of the semiconductor laser. Since the optical disk is rotated at a constant angular velocity, the drive current for the outermost track block becomes maximum WCTABL(B)$_{max}$.

FIG. 12 shows subroutine LSRADJ1 in normal operation, which determines the service life of the semiconductor laser while executing APC. In step S620, initialization subroutine ETAADJ of the first embodiment is called. In steps S630, S640, and S650, a difference between maximum WCTABL(B)$_{max}$ of the present write current and the data of write current backup memory WCBACK is calculated and set in general register A. In step S660, the difference is compared with LIMIT in order to discriminate the service life based on the following fact. Namely, when the service life of a semiconductor laser is exhausted, the light-emitting efficiency is degraded, and the drive current required for obtaining a desired light-emitting intensity changes (high or low). When the difference is less than LIMIT, i.e., if YES in step S660, subroutine LSRADJ1 ends. If NO in step S660, an abnormal state is displayed in step S680, and subroutine LSRADJ1 ends.

As described above, according to the second embodiment, a drive current corresponding to a predetermined light-emitting intensity is stored at the start of using the device (semiconductor laser) when the subroutine INITIAL is called. The actual drive current corresponding to the predetermined light-emitting intensity is compared with the stored value as required (every time subroutine LSRADJ1 is called), thereby correctly determining the remaining service life of individual semiconductor lasers.

A third embodiment of the present invention, which is a modification of the second embodiment, will be described.

Figure 13:
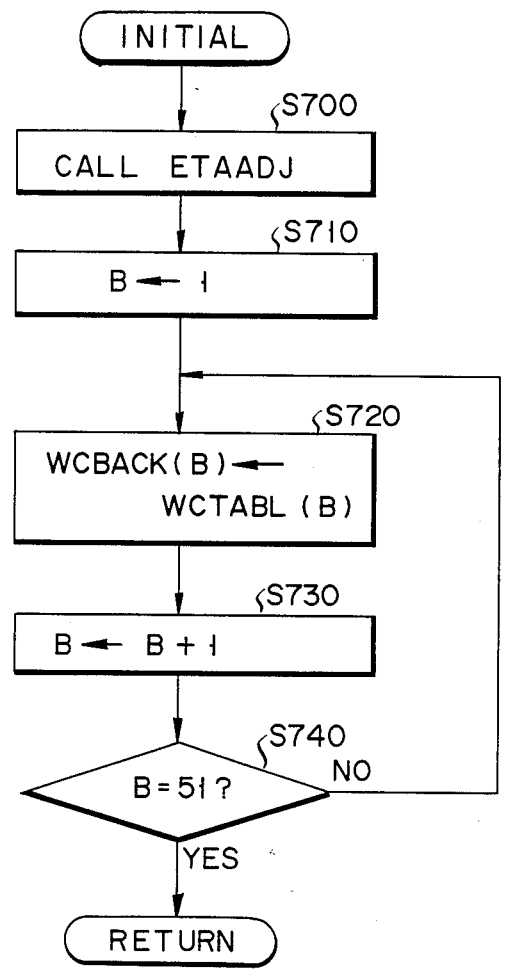
FIG. 13 is a flow chart of the initialization of the semiconductor laser drive device according to the third embodiment of the present invention.

FIGS. 13 and 14 respectively correspond to FIGS. 11 and 12, and show flow charts of the operation of the third embodiment.

In step S700 of subroutine INITIAL of FIG. 13, initialization subroutine ETAADJ of the first embodiment is called. In step S710, 1 is set in general register B (track block address). In step S720, write current table WCTABL(B) set in RAM 28 is stored in write current backup memory WCBACK(B). In step S730, B (i.e., the value in register B) is incremented by 1. In step S740, it is checked whether B is 51. If NO in step S740, step S720 is executed. If YES in step S740 subroutine INITIAL ends. In the second embodiment, the service life is determined using only the maximum write drive current. However, in the third embodiment, the write drive currents of the respective track blocks are used.

In subroutine LSRADJ2 of FIG. 14, initialization subroutine ETAADJ of the first embodiment is called in step S750. In step S760, 1 is set in register B. In step S770, the absolute value of the difference between present write current WCTABL(B) and the data in write current backup memory WCBACK(B) is calculated, and is set in general register A. In step S780, the absolute value is compared with LIMIT(B). If the absolute value is less than LIMIT(B), i.e., if YES in step S780, B is incremented by 1 in step S790, and it is checked in step S800 whether B is 51. If YES in step S800, subroutine LSRADJ2 ends. If NO in step S800, determination is performed for a drive current of the next track block. If NO in step S780, an abnormal state is displayed in step S820, and subroutine LSRADJ2 ends.

As described above, according to the third embodiment, the write drive currents for the respective track blocks are stored at the start of the device. Actual write drive currents of the respective track blocks are compared with the stored value during operation as required (every time subroutine LSRADJ2 is called) and, if any one of the write drive currents is determined to represent the end of the service life of the semiconductor laser, the semiconductor laser is determined to have exhausted its service life.

Although, the second and third embodiments use the first embodiment (ETAADJ subroutine) for obtaining the reference current data, the reference current data may be obtained by other methods.

What is claimed is:

1. A semiconductor laser drive device comprising:
   APC (automatic power control) means for energizing a semiconductor laser, detecting an intensity of a laser beam, comparing a desired intensity and the detected intensity, and for controlling a drive current to match the detected intensity with the desired intensity;
   first means for energizing said APC means at a first time point and for storing a plurality of drive currents which correspond to a plurality of intensities and are controlled by said APC means;
   second means for energizing said APC means at a second time point later than the first time point with the drive current corresponding to one of the intensities stored in said first means; and
   third means for, when the drive current corresponding to said one of the intensities is changed by said APC means at the second point of time, correcting the drive current corresponding to one of the other intensities and for energizing said APC means with the corrected drive current at a third time point later than the second time point.

2. A semiconductor laser drive device according to claim 1, in which said semiconductor laser is a semiconductor laser included in an optical disk read/write device in which a writing laser beam intensity is changed in accordance with the position of tracks and said first means stores the drive currents which correspond to the write laser beam intensities.

3. A semiconductor laser drive device according to claim 1, in which said first means comprises a semiconductor memory which is battery backed-up.

4. A semiconductor laser drive device according to claim 1, which further comprises alarm means for comparing the drive current controlled by said APC means with the drive current stored in said first means and for, when a difference therebetween exceeds a predetermined value, detecting a service life of said semiconductor laser.

5. A detecting device for detecting the service life of a semiconductor laser comprising:
   APC means for energizing a semiconductor laser, detecting an intensity of a laser beam, comparing a desired intensity and the detected intensity, and for controlling a drive current to match the detected intensity with the desired intensity;
   memory means for storing a drive current controlled by said APC means at the start of using the semiconductor laser; and
   alarm means for comparing the drive current controlled by said APC means with the drive current stored in said memory means and for, when a difference therebetween exceeds a predetermined value, detecting a service life of said semiconductor laser.

* * * * *